(12) United States Patent
Akahane (10) Patent No.: US 9,748,942 B2
(45) Date of Patent: Aug. 29, 2017

(54) SWITCHING ELEMENT DRIVING CIRCUIT (71) Applicant: FUJI ELECTRIC CO., LTD., Kawasaki-shi (JP)

(72) Inventor: Masashi Akahane, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 238 days.

(21) Appl. No.: 14/842,780

(22) Filed: Sep. 1, 2015

(65) Prior Publication Data

US 2015/0372671 A1 Dec. 24, 2015

Related U.S. Application Data

(63) Continuation of application No. PCT/JP2014/058536, filed on Mar. 26, 2014.

(30) Foreign Application Priority Data

Apr. 18, 2013 (JP) .................. 2013-087316

(51) Int. Cl.
*H02H 3/00* (2006.01)
*H03K 17/082* (2006.01)
*H03K 17/16* (2006.01)
*H02H 3/08* (2006.01)
*H02H 7/12* (2006.01)
(Continued)

(52) U.S. Cl.
CPC ............ *H03K 17/082* (2013.01); *H02H 3/08* (2013.01); *H02H 7/12* (2013.01); *H03K 5/24* (2013.01); *H03K 17/0828* (2013.01); *H03K 17/168* (2013.01); *H03K 17/6871* (2013.01)

(58) Field of Classification Search
CPC .................................................. H03K 17/082
USPC ............................................................ 361/18
See application file for complete search history.

(56) References Cited

U.S. PATENT DOCUMENTS 4,734,914 A * 3/1988 Yoshikawa ........ G06K 15/1214
250/205
8,310,795 B2 * 11/2012 Yabuzaki ............ H02M 1/4225
361/18
(Continued)

FOREIGN PATENT DOCUMENTS

JP 2005-033611 A 2/2005
JP 2010-062860 A 3/2010
(Continued)

*Primary Examiner* — Stephen W Jackson
(74) *Attorney, Agent, or Firm* — Rabin & Berdo, P.C.

(57) ABSTRACT

A switching element driving circuit includes a current detection unit that outputs a driving stop signal based on a level of current flowing through the switching element, and first and second control elements each connected to a control terminal of the switching element. A comparator controls the first control element based on a result of comparison of an output voltage of the driving circuit main unit with a first reference voltage. A differential amplifier drives the second control element in accordance with a voltage difference between the output voltage of the driving circuit main unit and a second reference so as to maintain the output voltage equal to the second reference voltage. An operation stopping unit stops the comparator and the differential amplifier to drive the first and second control elements, respectively, in response to the driving stop signal.

14 Claims, 7 Drawing Sheets

(51) Int. Cl.
  *H03K 5/24* (2006.01)
  *H03K 17/687* (2006.01)

(56) References Cited

U.S. PATENT DOCUMENTS

| | | | |
|---|---|---|---|
| 8,379,419 B2 * | 2/2013 | Yabuzaki | H02M 1/32 |
| | | | 323/901 |
| 9,019,677 B2 | 4/2015 | Kikuchi | |
| 9,184,743 B2 * | 11/2015 | Shimizu | H03K 17/082 |
| 2009/0174372 A1 | 7/2009 | Maeda et al. | |

FOREIGN PATENT DOCUMENTS

| | | |
|---|---|---|
| JP | 2012-231407 A | 11/2012 |
| WO | WO-2007/135789 A1 | 11/2007 |

* cited by examiner

SWITCHING ELEMENT DRIVING CIRCUIT

CROSS-REFERENCE TO RELATED APPLICATION

This is a continuation application of International Application number PCT/JP2014/058536, which was filed on Mar. 26, 2014 and designated the United States. Furthermore, this application claims the benefit of foreign priority of Japanese application number 2013-087316, filed on Apr. 18, 2013. The disclosures of both of these earlier applications are incorporated herein by reference.

BACKGROUND OF THE INVENTION

Technical Field

The present invention relates to a switching element driving circuit that includes an overcurrent protection function for such switching elements as IGBT (insulated-gate bipolar transistor) and MOS-FET (metal-oxide-semiconductor field-effect transistor).

Background Art

A well-known power converter to drive AC load is a power converter having two switching elements Q1 and Q2, which are totem pole-connected to form a half bridge circuit, and alternately turn ON/OFF so as to switch the DC voltage. The switching elements Q1 and Q2 are constituted by a high voltage IGBT or a high voltage MOS-FET, for example. It is also known that an overcurrent protection circuit for the switching elements Q1 and Q2 is built into a switching element driving circuit that drives the switching elements Q1 and Q2 ON/OFF.

Figure 6:
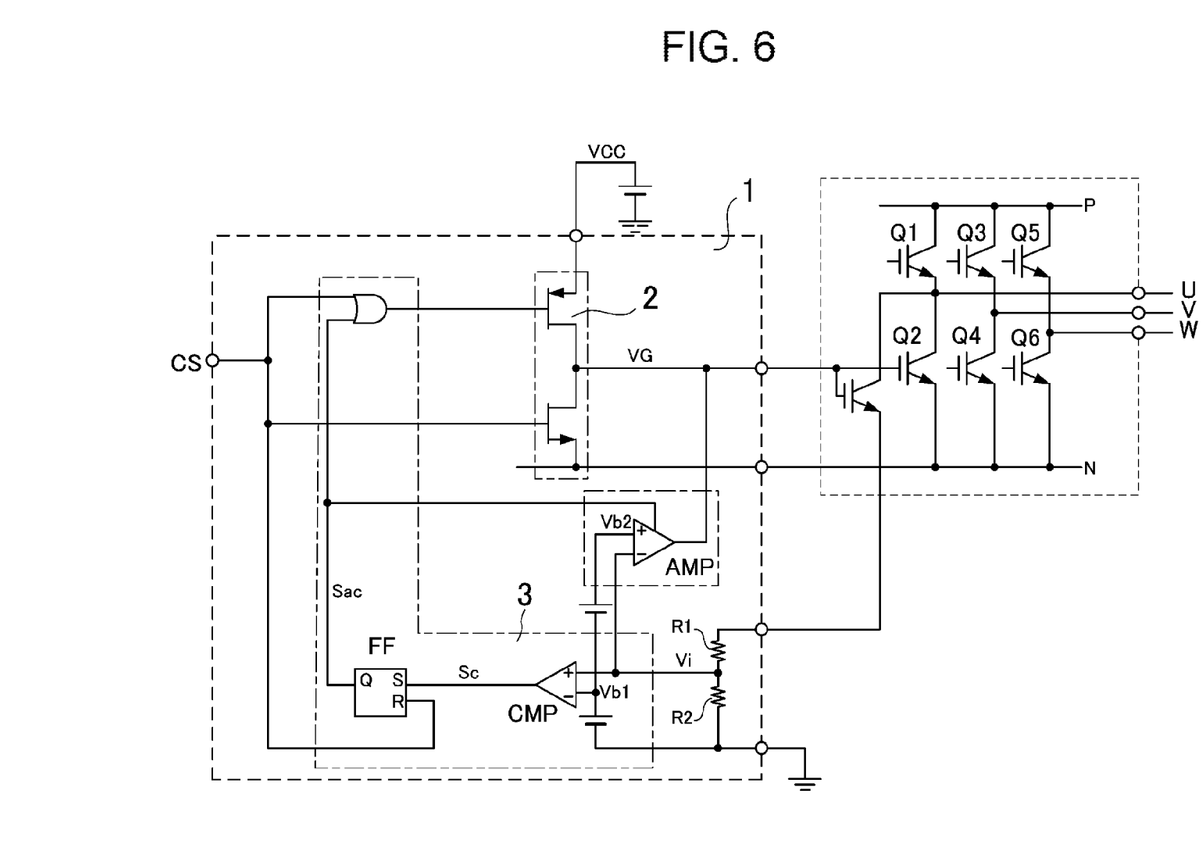
FIG. 6 is a schematic block diagram depicting an example of a conventional switching element driving circuit that includes an overcurrent protection function.

FIG. 6 is a schematic block diagram depicting a key section of an example of a conventional switching element driving circuit, where Q1 to Q6 are six switching elements constituted by IGBTs which form a half bridge circuit for each phase (U phase, V phase and W phase) of a three-phase AC load. The switching element driving circuit 1 is disposed for each of the switching elements Q1 to Q6, and drives each switching element Q1 to Q6 ON/OFF correlating with each other under a predetermined phase relationship.

In FIG. 6, the switching element driving circuit 1 for the switching element Q2 is illustrated, but the switching element driving circuits for the other switching elements Q1 and Q3 to Q6 also have the same configuration.

Here the switching element driving circuit 1 includes a driving circuit main unit 2 that applies predetermined gate voltage VG to the switching element Q2, to drive the switching element Q2 ON/OFF. This driving circuit main unit 2 is constituted by a p-channel MOS-FET and an n-channel MOS-FET which are totem pole-connected, for example. The p-channel MOS-FET and the n-channel MOS-FET complementarily turn ON/OFF when a driving control signal CS is received, and generate the gate voltage VG as pulses.

An overcurrent protection circuit 3, included in the switching element driving circuit 1, has a comparator CMP that detects the current flowing through the switching element Q2 by converting the current into voltage via voltage dividing resistors R1 and R2, and compares the detected voltage Vi and a reference voltage Vb1 to specify the overcurrent threshold. The comparator CMP plays a role of disabling input of the driving control signal CS to the p-channel MOS-FET by setting a flip-flop FF when overcurrent is detected. Therefore when the flip-flop FF is set, driving the switching element Q2 ON by the driving circuit main unit 2 is stopped.

The overcurrent protection circuit 3 includes a differential amplifier AMP that controls the gate voltage VG applied to the switching element Q2 based on the reference voltage Vb2, which is set higher than the reference voltage Vb1 (Vb2>Vb1), and the detected voltage Vi. This differential amplifier AMP plays a role of releasing the switching element Q2 from the overcurrent state by dropping the gate voltage VG down to the reference voltage Vb2 when the detected voltage Vi is higher than the reference voltage Vb2. The function to control the current flowing through the switching element Q2 by the differential amplifier AMP is described in detail, for example, in Japanese Patent Application Laid-Open No. 2010-62860.

SUMMARY OF THE INVENTION

Figure 7:
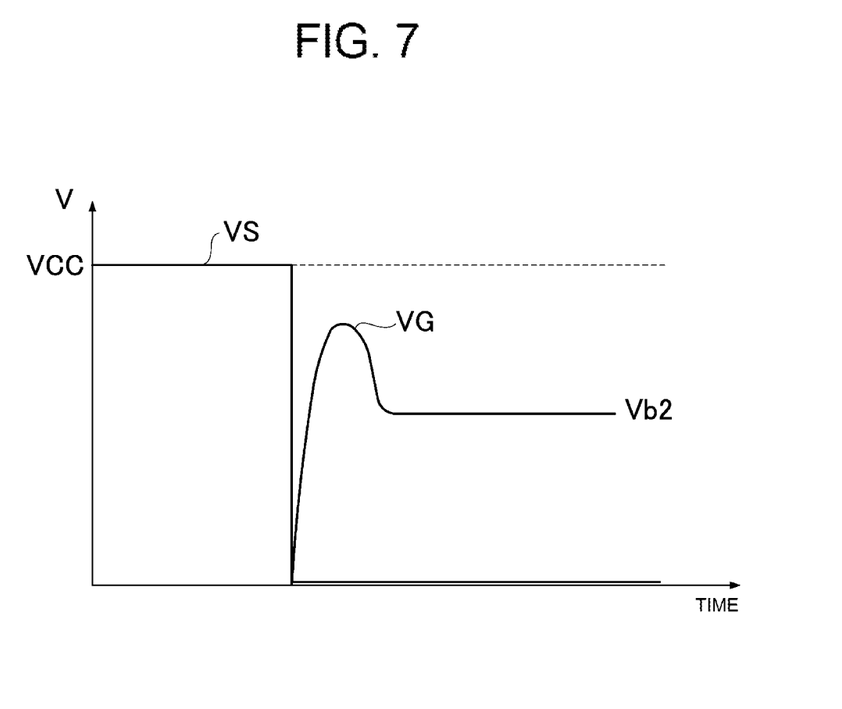
FIG. 7 is a graph showing the operation characteristic of the conventional circuit illustrated in FIG. 6.

In the switching element driving circuit 1 configured as described above, the p-channel MOS-FET is controlled to OFF when overcurrent is detected, that is, control to suppress the gate voltage VG is assigned to the differential amplifier AMP alone. In concrete terms, when the driving control signal CS is inverted to the low level, as shown in the change of the gate voltage VG in FIG. 7, the p-channel MOS-FET turns ON and the gate voltage VG rises accordingly. Then the switching element Q2 turns ON by this gate voltage VG, and current that flows through the switching element Q2 increases. If the current that flows through the switching element Q2 (detected voltage Vi) exceeds the overcurrent threshold (reference voltage Vb2), the gate voltage VG is suppressed by the feedback control via the differential amplifier AMP, and is converged to the reference voltage Vb2.

As mentioned above, in the case of controlling the gate voltage VG, it is preferable to suppress the transitional increase of the gate voltage VG, by maximizing the control responsiveness, when the overcurrent is detected. However in the case of the above mentioned feedback control loop via the differential amplifier AMP, delay time is long. This means that high-speed response is difficult when overcurrent is detected. Another problem is that the control response time via the differential amplifier AMP is easily influenced by the gate capacitance of the switching element Q2.

With the foregoing in view, it is an object of the present invention to provide a switching element driving circuit that has fast control responsiveness to the gate voltage of the switching element when the overcurrent is detected, and can effectively protect the switching element from the overcurrent by quickly converging the gate voltage to a predetermined voltage.

To achieve the above object, a switching element driving circuit according to the present invention has: a driving circuit main unit that controls gate voltage applied to a control terminal of a switching element constituted by a high voltage IGBT or a high voltage MOS-FET, and drives the switching element ON/OFF; a current detection unit that outputs a driving stop signal for the switching element when current flowing through the switching element exceeds an overcurrent threshold; a comparator that drives a first control element connected to a control terminal of the switching element when output voltage of the driving circuit main unit exceeds a first reference voltage so as to drop the output voltage; a differential amplifier that drives a second control element connected to the control terminal of the switching element in accordance with a voltage difference between the output voltage of the driving circuit main unit and a second reference voltage that is lower than the first reference voltage, so as to hold the output voltage at the second reference voltage; and an operation stopping unit that enables the comparator and the differential amplifier to drive the first and second control elements when the current detection unit outputs the driving stop signal.

It is preferable that the operation stopping unit includes a gate circuit that applies an output of the comparator to the first control element when the driving stop signal is output, and a third control element that forcibly turns the second control element OFF when the driving stop signal is not output. It is also preferable that the driving circuit main unit includes, in the input stage thereof, an input gate circuit that disables input of a driving control signal to the driving circuit main unit when the driving stop signal is output, so as to stop driving the switching element ON/OFF.

Each of the first to third control elements is an MOS-FET, for example. It is preferable that the first and second control elements are disposed such that the saturation current amount thereof can be adjusted in accordance with a gate capacitance of the switching element.

According to the switching element driving circuit having the above configuration, if the output voltage of the driving circuit main unit exceeds the first reference voltage, the first control element connected to the control terminal of the switching element is turned ON by the comparator, and the gate voltage of the switching element is quickly dropped. Furthermore, this control is performed simply by driving the first control element ON, hence, compared with the conventional feedback control of the gate voltage via the differential amplifier, the gate voltage of the switching element can be more quickly dropped and the control responsiveness can be improved.

Moreover, the feedback control of the second control element by the differential amplifier is activated after the control to drop the gate voltage by the comparator, based on the difference of control responsiveness, is activated. As a result, the gate voltage is controlled via the second control element, under control of the differential amplifier, and the gate voltage converges to a predetermined voltage. Therefore when overcurrent is generated, the gate voltage is quickly converted to a predetermined voltage with good control responsiveness, by a combination of the control of the first control element using the comparator and the control of the second control element using the differential amplifier, and this converted state can be stably held. As a consequence, the responsiveness when the overcurrent is generated can be increased, and the switching element can be protected with certainty.

DETAILED DESCRIPTION OF THE INVENTION

A switching element driving circuit according to an embodiment of the present invention will now be described with reference to the drawings.

Figure 1:
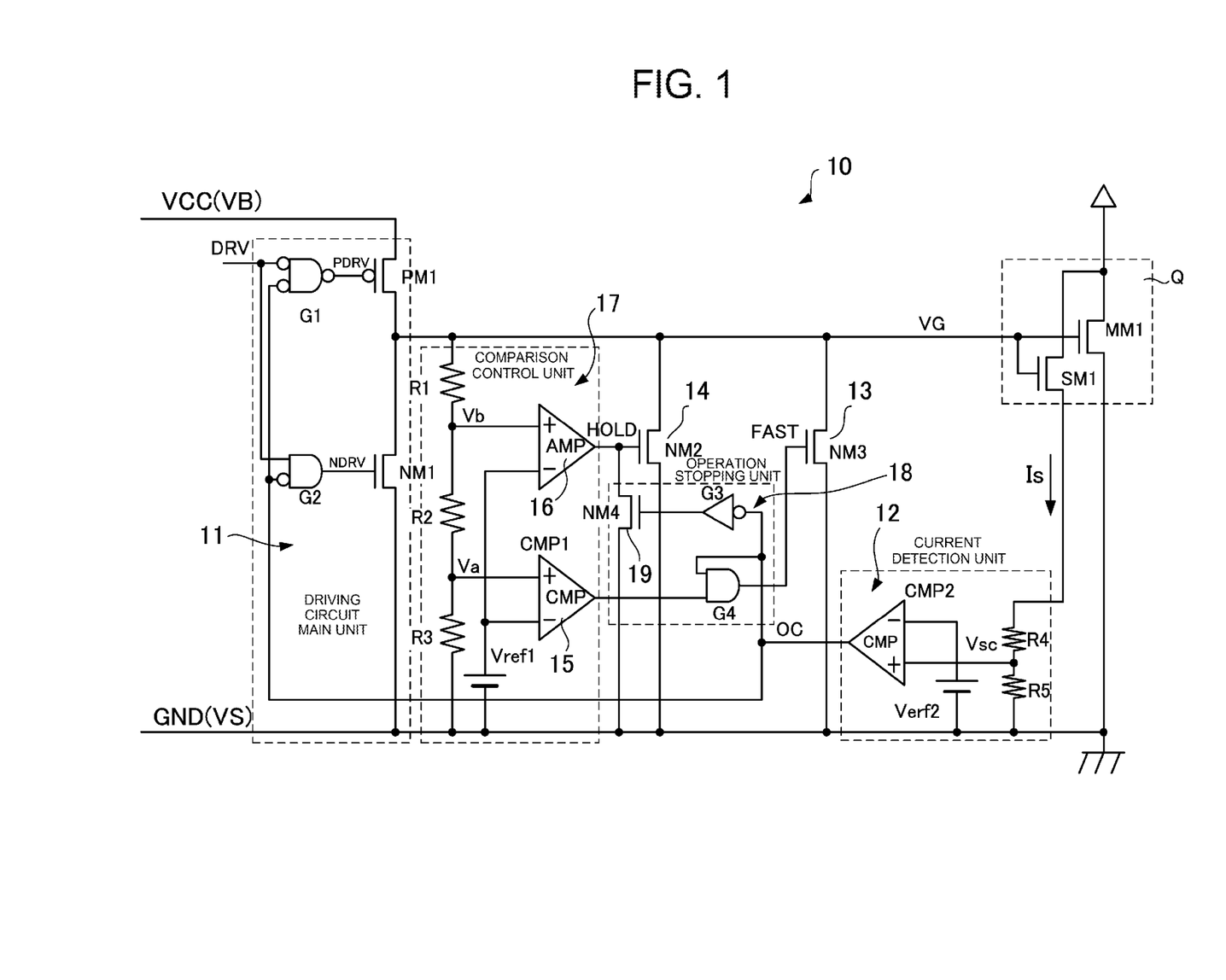
FIG. 1 is a schematic block diagram of a switching element driving circuit according to an embodiment of the present invention.

FIG. 1 is a schematic block diagram depicting a key section of the switching element driving circuit 10 according to the embodiment, where Q is a switching element driven by the switching element driving circuit 10. This switching element Q is constituted by an n-channel high voltage MOS-FET (MM1), for example, and includes a MOS-FET (SM1) for current detection which is connected in parallel. The MOS-FET for current correction (SM1) includes a channel region that is [1/n] of the high voltage MOS-FET (MM1), and outputs [1/100] current Is, for example, that is in proportion to the current flowing through the high voltage MOS-FET (MM1).

The switching element driving circuit 10 is configured so as to operate by receiving power supply voltage VCC, of which reference potential is the ground potential (GND), for example. To drive the switching element Q on the upper arm side of the half bridge circuit constituting the above mentioned power converter, the switching element driving circuit 10 is configured so as to operate by receiving power supply voltage VB, of which reference potential is the midpoint potential VS of the half bridge circuit.

The switching element driving circuit 10 includes a driving circuit main unit 11 that drives the switching element Q ON/OFF. The driving circuit main unit 11 is constituted by a p-channel MOS-FET (PM1) and an n-channel MOS-FET (NMI) which are totem pole-connected. The p-channel MOS-FET and the n-channel MOS-FET complementarily turn ON/OFF when a driving control signal DRV is received, and generate pulses of the gate voltage VG in the drain. In other words, for voltage at the connection point of each drain of the p-channel MOS-FET (PM1) and the n-channel MOS-FET (NM1), that is, the drain voltage, the gate voltage VG that is applied to the control terminal of the switching element Q is generated as the output voltage.

The driving circuit main unit 11 also includes an input gate circuit in the input stage thereof, and the input gate circuit is constituted by logic circuits G1 and G2 for controlling the input of the driving control signal DRV. The logic circuits G1 and G2 constituting the input gate circuit are controlled by the output of a later mentioned current detection unit when the later mentioned current detection unit detects overcurrent. Therefore only when the input gate circuit is enabled, the driving circuit main unit 11 generates and outputs pulse signals to drive the switching element Q ON/OFF as the gate voltage VG.

The current detection unit 12 included in the switching element driving circuit 10, on the other hand, has voltage dividing resistors R4 and R5 which divide and detect voltage generated by the current output from the MOS-FET (SM1) for current detection in the switching element Q. The current detection unit 12 includes a comparator CMP2 that compares the detected voltage Vsc, which is detected by the voltage dividing resistors R4 and R5 and is in proportion to the currrent flowing through the switching element Q, with a reference voltage Vref2 which corresponds to the predetermined overcurrent threshold. The comparator CMP2 determines that the overcurrent is flowing through the switching element Q when the detected voltage Vsc exceeds the reference voltage Vref2, and outputs a driving stop signal OC.

When the current detection unit 12 detects overcurrent, the input gate circuit, which is constituted by the logic circuits G1 and G2 disposed in the input stage of the driving circuit main unit 11, disables applying the driving control signal DRV to the p-channel MOS-FET (PM1) and the n-channel MOS-FET (NM1) by receiving the output of the comparator CMP2. In other words, when the current detection unit 12 detects overcurrent, the input gate circuit disables operation of the driving circuit main unit 11, so as to disable driving the switching element Q ON/OFF.

The characteristic of the switching element driving circuit 10, in addition to the above mentioned basic configuration, is that the first control element 13 (NM3), which is an n-channel MOS-FET, and a second control element 14 (NM2), which is an n-channel MOS-FET, are inserted in parallel between the gate terminal of the switching element Q and the reference potential. Further, the switching element driving circuit 10 includes a comparator 15 (CMP1) which controls ON/OFF of the first control element 13 (NM3), and a differential amplifier 16 (AMP) which controls operation of the second control element 14 (NM2). The comparator 15 (CMP1) and the differential amplifier 16 (AMP) constitute a comparison control unit 17 for controlling the gate voltage VG.

A function of the comparator 15 (MP1) is primarily driving the first control element 13 (NM3) ON and dropping the gate voltage VG when the output voltage of the driving circuit main unit 11, that is, the gate voltage VG of the switching element Q, exceeds the first reference voltage V1 (not illustrated). Here the control for the first control element 13 (NM3) is called "FAST control". The differential amplifier 16 (AMP) is driven when the output voltage of the driving circuit main unit 11 exceeds the second reference voltage V2, which is lower than the first reference voltage V1 (not illustrated). Then the differential amplifier 16 (AMP) controls the operation of the second control element 14 (NM2) in accordance with the voltage difference between the gate voltage VG and the second reference voltage V2.

Here the first reference voltage V1 is set to 12 V, for example, and the second reference voltage V2 is set to 11 V, for example. The reference voltages V1 and V2 are set this way so as to operate the comparator 15 (CMP1) before the differential amplifier 16 (AMP) in the operation to drop the VG voltage. Hence when overcurrent is generated, operation of the differential amplifier 16 (AMP) is started after the FAST control is started. Then the gate voltage VG is feedback-controlled by the differential amplifier 16 (AMP) controlling the operation of the second control element 14 (NM2), and the gate voltage VG is converged to the second reference voltage V2 and is held there. Here this control for the second control element 14 (NM2) is called "HOLD control".

In this embodiment, the reference voltage Vref1 is supplied to the comparator 15 (CMP1) and the differential amplifier 16 (AMP) respectively as the reference voltage, as illustrated in FIG. 1. The gate voltage VG is divided into the voltages Va and Vb by the voltage dividing resistors R1, R2 and R3, and the voltages Va and Vb are supplied to the comparator 15 (CMP1) and the differential amplifier 16 (AMP) respectively.

Therefore by comparing the reference voltage Vref1 and the voltage Va generated by dividing the gate voltage VG, the comparator 15 (CMP1) equivalently executes the above mentioned comparison processing between the gate voltage VG and the first reference voltage V1. In the same manner, by inputting the reference voltage Vref1 and the voltage Vb generated by dividing the gate voltage VG respectively, the differential amplifier 16 (AMP) equivalently executes the above mentioned operation control for the second control element 14 (NM2) based on the differential voltage between the gate voltage VG and the second reference voltage V2.

The switching element driving circuit 10 also includes an operation stopping unit 18. The operation stopping unit 18 enables the comparator 15 (CMP1) and the differential amplifier 16 (AMP) in the comparison control elements 13 and 14 (NM3 and NM2) to drive the first and second control elements 13 and 14 (NM3 and NM2) when the comparator CMP2 of the current detection unit 12 outputs the driving stop signal OC. In concrete terms, the operation stopping unit 18 includes an AND circuit G4 (a second logic circuit), which applies the output of the comparator 15 (CMP1) to the first control element 13 (NM3) only when the driving stop signal OC is output.

Furthermore, the operation stopping unit 18 includes a third control element 19 (NM4) which is an n-channel MOS-FET inserted between the gate of the second control element 14 (NM2) and the ground potential (GND). The third control element 19 (NM4) is driven by a signal generated by inverting the driving stop signal OC via a NOT circuit G3 (a first logic circuit). Therefore when overcurrent is not generated in the switching element Q, that is, during normal operation, the third control element 19 (NM4) forcibly disables operation of the second control element 14 (NM2).

In other words, the operation stopping unit 18 enables driving of the first and second control elements 13 and 14 (NM3 and NM2) only when the current detection unit 12 detects overcurrent. As a result, the comparator 15 (CMP1) and the differential amplifier 16 (AMP) execute the FAST control and the HOLD control respectively to drop the gate voltage VG, as mentioned above. Thereby the current flowing through the switching element Q is decreased, and as a result the overcurrent protection operation is implemented.

Figure 2:
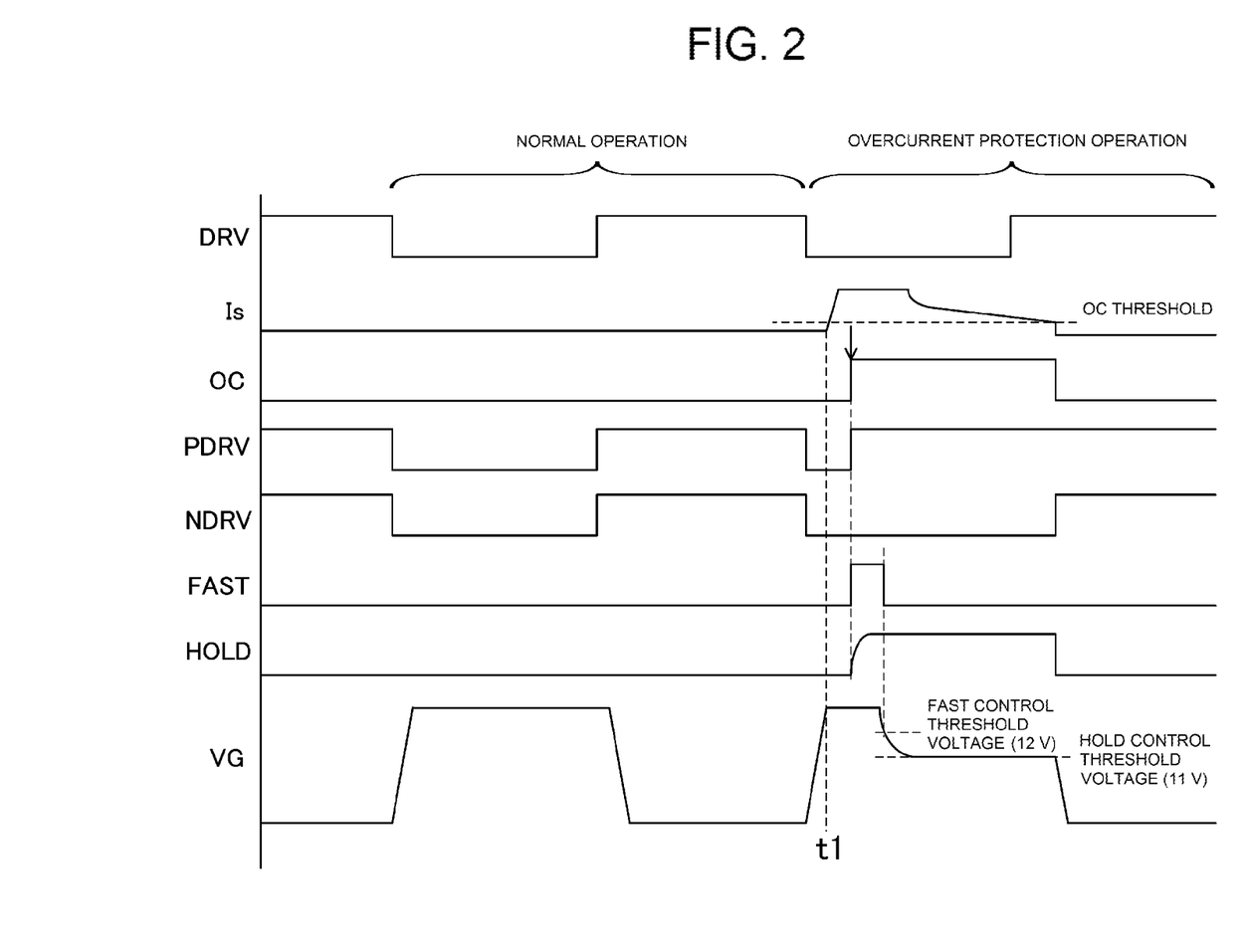
FIG. 2 is a timing diagram for describing the operation of the switching element driving circuit illustrated in FIG. 1.

FIG. 2 is a timing diagram depicting basic operation of the switching element driving circuit 10 configured as mentioned above. During normal operation, the current Is flowing through the switching element Q does not reach the overcurrent detection level even if the switching element Q is driven ON/OFF according to the driving control signal DRV. Therefore the current detection unit 12 does not output the driving stop signal OC during normal operation. This means that the driving signals PDRV and NDRV generated from the driving control signal DRV via the input gate circuit are directly applied to the p-channel MOS-FET (PM1) and the n-channel MOS-FET (NM1) of the driving circuit main unit 11.

The driving stop signal OC is not output at this time, hence neither the first control element 13 (NM3) nor the second control element 14 (NM2) is driven ON. Therefore the above mentioned FAST control and HOLD control are not executed. As a result, the gate voltage VG applied to the switching element Q becomes the voltage generated in each drain of the p-channel MOS-FET (PM1) and the n-channel MOS-FET (NM1) of the driving circuit main unit 11.

Whereas if the current Is flowing through the switching element Q becomes abnormally high, as shown at timing t1 in FIG. 2, the driving stop signal OC is output at a point when the detected voltage Vsc, generated by the current Is exceeds the reference voltage Vref2. Then by this driving stop signal OC, the input gate circuit interrupts output of the driving signals NDRV and PDRV. As a consequence, in the driving circuit main unit 11, the p-channel MOS-FET (PM1) is held in the OFF state, and the n-channel MOS-FET (NM1) is also held in the OFF state.

At this time, the operation stopping unit 18 that received the driving stop signal OC enables the AND circuit G4, and turns the third control element 19 (NM4) OFF. As a result, the output of the comparator 15 (CMP1) is applied to the gate of the first control element 13 (NM3), and the first control element 13 (NM3) executes the FAST control to drop the gate voltage VG. By this FAST control, the drain voltage of the p-channel MOS-FET (PM1), that is, the gate voltage VG, is dropped.

Moreover, at this time the third control element 19 (NM4) in the operation stopping unit 18 turns OFF, hence the output of the differential amplifier 16 (AMP) is applied to the second control element 14 (NM2). Then under control of the differential amplifier 16 (AMP), the control to maintain the gate voltage VG at a constant level, that is the above mentioned HOLD control, is started via the second control element 14 (NM2). This HOLD control is executed after a control response delay, which is unique to the differential amplifier 16 (AMP).

As a result, as shown in FIG. 2, the gate voltage VG drops by the FAST control and the HOLD control under control of the comparator 15 (CMP) with virtually no delay from the time when overcurrent is detected. Then after the FAST control is stopped by the comparator 15 (CMP1) as the gate voltage VG drops, the gate voltage VG is converged to the second reference voltage V2, and is held there under control of the differential amplifier 16 (AMP). Therefore the gate voltage VG is dropped with good responsiveness so as to suppress the overcurrent of the switching element Q, and is therefore held at a predetermined voltage so that a constant current can be supplied to the switching element Q. When the n-channel MOS-FET (NM1) is turned ON by the driving signal NDRV, generated from the driving control signal DRV via the input gate circuit, the gate voltage VG is set to the ground potential.

Therefore according to the switching element driving circuit 10 that executes the control to drop the gate voltage VG by operating as mentioned above when overcurrent is generated, the overcurrent protection operation for the switching element Q is made faster. Further, even if overcurrent is generated, the gate voltage VG can be held at a constant level. Consequently the operation state of the switching element Q can be maintained, and the switching element Q can be driven ON/OFF without problems. As a result, stable operation can be guaranteed for the power converter which includes the switching element Q.

Figure 3:
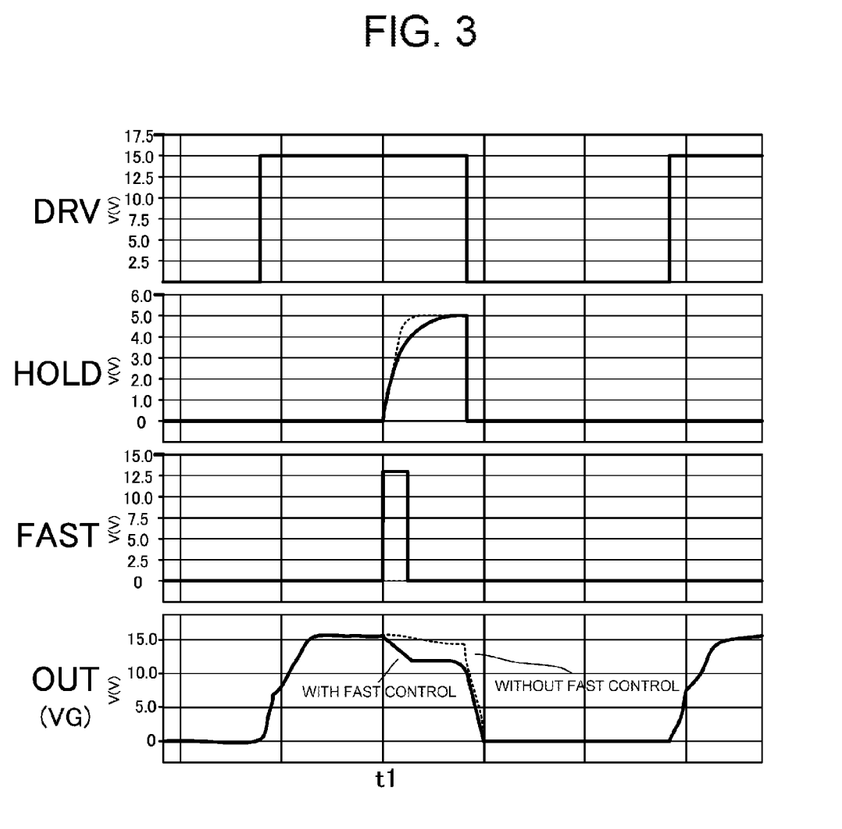
FIG. 3 is a set of diagrams for describing the effect of the switching element driving circuit according to the present invention.

FIG. 3 shows the control response characteristic of the switching element driving circuit 10 according to the present invention for the switching element Q (solid lines), in comparison with the control response characteristic of the conventional switching element driving circuit 1 illustrated in FIG. 6 (broken lines). As shown in FIG. 3, when overcurrent is generated in the switching element Q, the FAST signal is generated in the switching element driving circuit 10 according to the present invention, and the first control element 13 (NM3) is turned ON with good responsiveness. Therefore the output voltage OUT of the switching element driving circuit 10, that is, the gate voltage VG to be applied to the gate of the switching element Q, is dropped without delay.

In the case of the conventional switching element driving circuit 1, the FAST control function, which is characteristic of the present invention, is not included, hence the output voltage OUT thereof is simply held at an approximately constant voltage level, as indicated by the broken lines in FIG. 3. This proves that the switching element driving circuit 10 according to the present invention has a better protective operation function against overcurrent, compared with the conventional switching element driving circuit 1, in terms of control responsiveness. Moreover, the control responsiveness can be improved by a simple configuration, that is, the comparator 15 (CMP1) is disposed in parallel with the differential amplifier 16 (AMP) and the above mentioned FAST control is executed. Therefore the practical advantages of the present invention are enormous.

Figure 4:
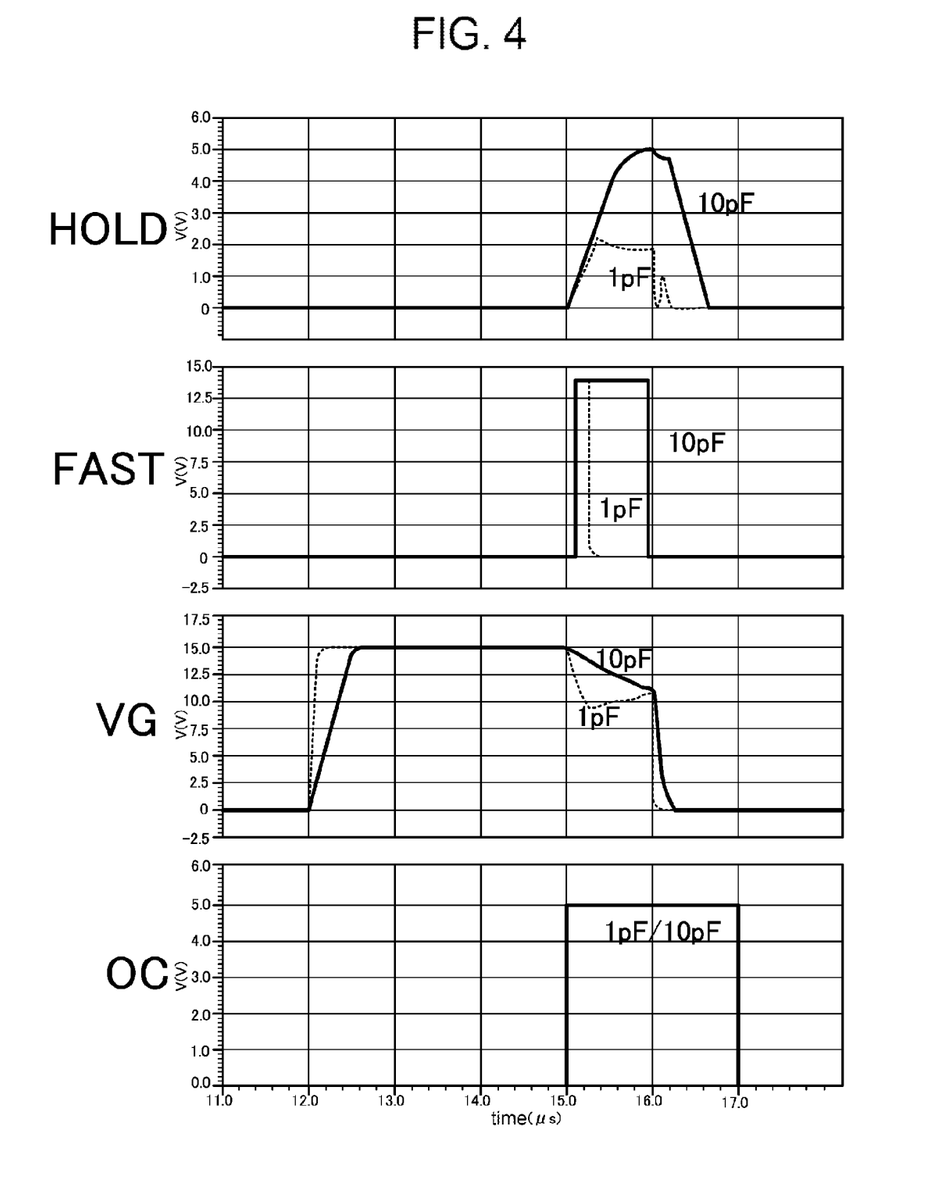
FIG. 4 is a set of diagrams for showing the difference of the control response characteristic that depends on the gate capacitance of the switching element.

If the saturation current value of the first control element 13 (NM3) and that of the second control element 14 (NM2) are equal, the response characteristic of the FAST control, the response characteristic of the HOLD control and the change characteristic of the gate voltage VG change depending on the gate capacitance (load capacitance) of the switching element Q. FIG. 4 shows a comparison of the characteristic when the gate capacitance of the switching element Q is 10 pF (solid lines) and when it is 1 pF (broken lines) under the condition that the saturation current of each control element 13 and 14 (NM3 and NM2) is 32 mA. As shown in FIG. 4, it became clear that if the saturation current of each control element 13 and 14 (NM3 and NM2) is the same, the response characteristic depends on the gate capacitance of the switching element Q.

Figure 5:
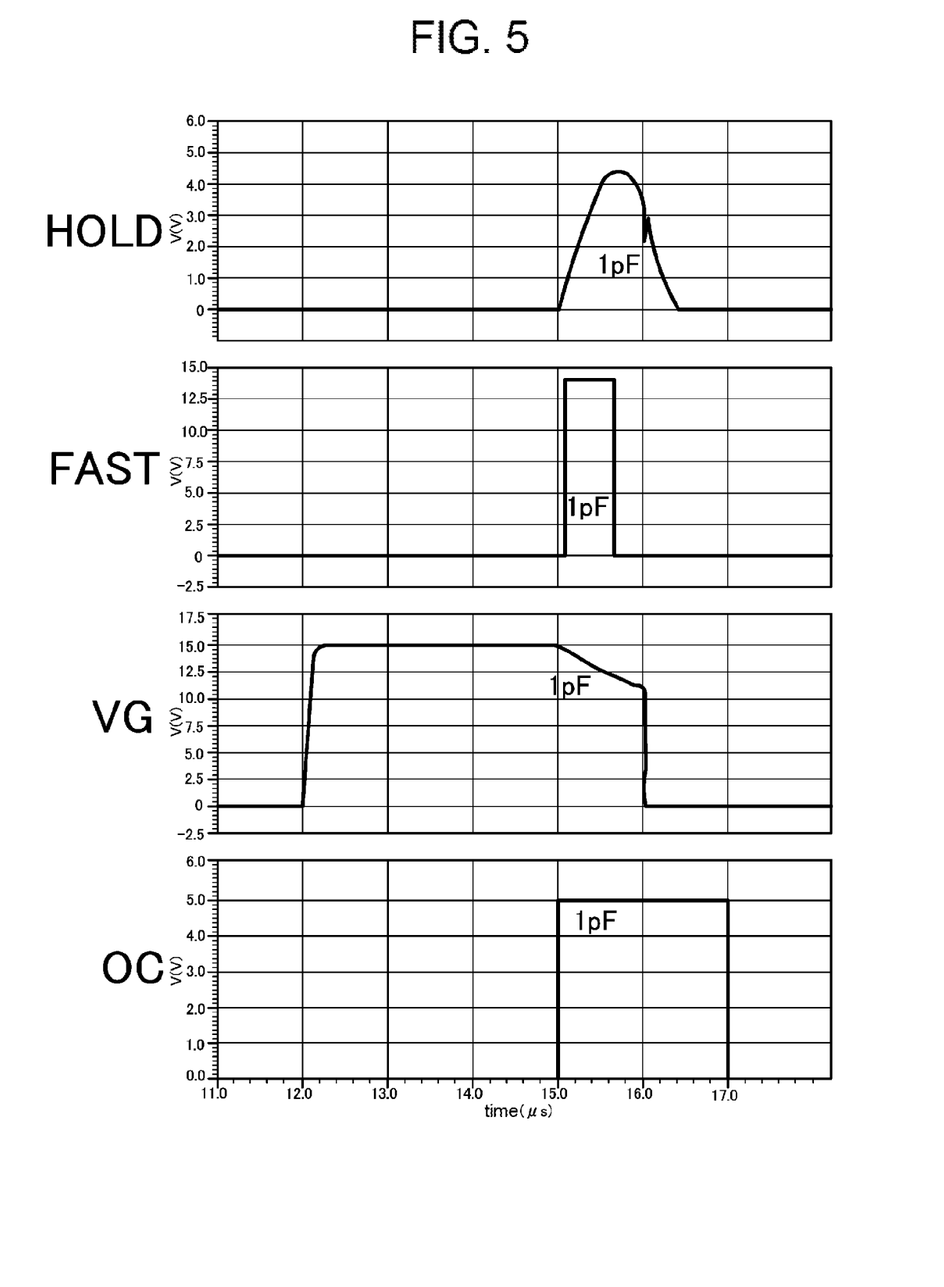
FIG. 5 is a set of diagrams for showing the control response characteristic when the saturation current amount of the second control element is adjusted.

It also became clear that the response characteristic of the FAST control, the response characteristic of the HOLD control and the change characteristic of the gate voltage VG are improved, as shown in FIG. 5, if the channel width of the first control element 13 (NM3) is changed, and the saturation current value thereof is changed to 3.2 mA, which is ⅒ of the above mentioned current value. Moreover, this characteristic is approximately the same as the case when the gate capacitance of the switching element Q is 10 pF shown in FIG. 4.

Therefore the differential amplifier 16 (AMP) can efficiently control the gate voltage VG to a constant level by changing the channel width of the first control element 13 (NM3) to set the saturation current value thereof to be low. This means that by appropriately setting the saturation current value of the first control element 13 (NM3), stable protective operation against overcurrent can be executed, regardless of the gate capacitance (load capacitance) of the switching element Q, along with the above mentioned high-speed control to drop the gate voltage VG by the comparator 15 (CMP1). As a consequence, the switching element driving circuit 10 according to the present invention can execute the overcurrent protection operation quickly and stably for the switching element Q, and the practical advantages thereof are enormous.

The present invention is not limited to the embodiment described above. Here the switching element driving circuit 10 for the switching element Q, constituting the lower arm of the half bridge circuit of the power converter, was described, but needless to say, the switching element driving circuit 10 for the switching element Q, constituting the upper arm, is configured in the same way. The switching element driving circuit 10 may be implemented as an intelligent power module (IPM), where the switching element driving circuit 10 is integrated on the semiconductor substrate along with the switching element Q. The present invention can be modified in various ways within the scope that does not depart from the true spirit thereof.

What is claimed is:

1. A driving circuit for a switching element, comprising:
   a driving circuit main unit that controls turning of the switching element on and off;
   a current detection unit that outputs a driving stop signal based on a level of current flowing through the switching element;
   first and second control elements each connected to a control terminal of the switching element;
   a comparator that controls the first control element based on a result of comparison of an output voltage of the driving circuit main unit with a first reference voltage;
   a differential amplifier that drives the second control element in accordance with a voltage difference between the output voltage of the driving circuit main unit and a second reference voltage, so as to maintain the output voltage equal to the second reference voltage, the second reference voltage being lower than the first reference voltage; and
   an operation stopping unit that stops operations of the comparator and the differential amplifier to drive the first and second control elements, respectively, in response to the driving stop signal when the driving stop signal is output from the current detection unit.

2. The driving circuit according to claim 1, wherein the switching element is a high voltage insulated-gate bipolar transistor (IGBT) or a high voltage metal-oxide-semiconductor field-effect transistor (MOSFET), and
   the first and second control elements are MOS-FETs inserted between the control terminal of the switching element and a reference voltage supply.

3. The driving circuit according to claim 1, wherein
   the operation stopping unit includes a gate circuit that applies an output of the comparator to the first control element when the driving stop signal is output, and
   a third control element that forcibly turns the second control element off when the driving stop signal is absent.

4. The driving circuit according to claim 1, wherein the driving circuit main unit includes, in an input stage thereof, an input gate circuit that disables input of a driving control signal to the driving circuit main unit when the driving stop signal is output, so as to stop driving the switching element to turn on and turn off.

5. The driving circuit according to claim 1, wherein the saturation current amount of the first and second control elements are adjusted in accordance with a gate capacitance of the switching element.

6. The driving circuit according to claim 1, wherein the comparator drives the first control element when the output voltage of the driving circuit main unit exceeds the first reference voltage.

7. The driving circuit according to claim 1, wherein the driving circuit main unit controls a voltage applied to the control terminal of the switching element to drive the switching element to turn on and off.

8. The driving circuit according to claim 1, wherein the current detection unit outputs the driving stop signal for the switching element when current flowing through the switching element exceeds an overcurrent threshold.

9. The driving circuit according to claim 1, wherein the comparator compares the output voltage of the driving circuit main unit with the first reference voltage, and drives the first control element based on a result of the comparison so as to decrease the output voltage.

10. The driving circuit according to claim 1, wherein the operation stopping unit includes a third control element that turns the second control element off when the driving stop signal is at a low level.

11. The driving circuit according to claim 10, wherein the operation stopping unit further includes a first logic circuit that inverts a level of the driving stop signal and inputs the level-inverted driving stop signal to the third control element.

12. The driving circuit according to claim 10, wherein the operation stopping unit further includes a second logic circuit that outputs the output of the comparator to the first control element when the driving stop signal is at a high level.

13. A protection circuit of a switching element controlled to turn on and off by a driving circuit main unit, comprising:
   first and second control elements each connected to a control terminal of the switching element;
   a current detection unit that outputs a driving stop signal based on a level of current flowing through the switching element;
   a comparator that controls the first control element based on a result of comparison of an output voltage of the driving circuit main unit with a first reference voltage;
   a differential amplifier that drives the second control element in accordance with a voltage difference between the output voltage of the driving circuit main unit and a second reference so as to maintain the output voltage equal to the second reference voltage, the second reference voltage being lower than the first reference voltage; and
   an operation stopping unit that stops the comparator and the differential amplifier to drive the first and second control elements, respectively, in response to the driving stop signal when the driving stop signal is output from the current detection unit.

14. A power converter to drive AC load, comprising:
   a switching element;
   a driving circuit main unit that controls turning of the switching element on and off;
   first and second control elements that are each connected to a control terminal of the switching element;
   a current detection unit that outputs a driving stop signal based on a level of current flowing through the switching element;
   a comparator that controls the first control element based on a result of comparison of an output voltage of the driving circuit main unit with a first reference voltage;
   a differential amplifier that drives the second control element in accordance with a voltage difference between the output voltage of the driving circuit main unit and a second reference so as to maintain the output voltage equal to the second reference voltage, the second reference voltage being lower than the first reference voltage; and
   an operation stopping unit that stops the comparator and the differential amplifier to drive the first and second control elements, respectively, in response to the driving stop signal when the driving stop signal is output from the current detection unit.

* * * * *